US012619022B2

(12) United States Patent
Yamada et al.

(10) Patent No.:    US 12,619,022 B2
(45) Date of Patent:        May 5, 2026

(54) LIGHT-EMITTING MODULE AND PLANAR LIGHT SOURCE

(71) Applicant: NICHIA CORPORATION, Anan (JP)

(72) Inventors: Yuichi Yamada, Itano-gun (JP); Keiji Emura, Anan (JP); Seitaro Akagawa, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/991,693

(22) Filed: Dec. 23, 2024

(65) Prior Publication Data

US 2025/0212583 A1      Jun. 26, 2025

(30) Foreign Application Priority Data

Dec. 25, 2023    (JP) ................................. 2023-218439

(51) Int. Cl.
*F21V 8/00*            (2006.01)
*G02F 1/1335*          (2006.01)
                       (Continued)

(52) U.S. Cl.
CPC ......... *G02B 6/0021* (2013.01); *G02B 6/0068* (2013.01); *G02B 6/0073* (2013.01); *G02F 1/133603* (2013.01); *G02F 1/133611* (2013.01); *G02F 1/133613* (2021.01); *H10H 29/24* (2025.01); *H10H 29/852* (2025.01); *H10H 29/855* (2025.01); *H10H 29/8512* (2025.01);
                       (Continued)

(58) Field of Classification Search
CPC .. G02B 6/0021; G02B 6/0068; G02B 6/0073;

G02F 1/133603; G02F 1/133611; G02F 1/133613; H10H 29/24; H10H 29/852; H10H 29/855; H10H 29/8512; H10H 29/856
USPC ....................................................... 362/257
See application file for complete search history.

(56) References Cited

U.S. PATENT DOCUMENTS

2010/0061081 A1*   3/2010   Muschaweck ............ F21K 9/00
                                                              445/3
2018/0128458 A1     5/2018   Fukasawa
                          (Continued)

FOREIGN PATENT DOCUMENTS

JP        2018-022884       2/2018
JP        2019-061929       4/2019
                     (Continued)

*Primary Examiner* — Keith G. Delahoussaye
(74) *Attorney, Agent, or Firm* — MORI & WARD, LLP

(57)            ABSTRACT

A light-emitting module includes light source units arranged in a first direction and in a second direction orthogonal to the first direction. Each of the light source units includes at least one light-emitting element and a light-transmissive member covering the light-emitting element and having a lateral surface from which light from the light-emitting element is emitted. In a top view, on a normal line passing through a center of the lateral surface being Mth in the first direction and Nth in the second direction, the lateral surface being (M+1)th in the first direction and {N+L (where L is a natural number greater than or equal to 2)}th in the second direction is positioned, while no light source unit is present between the light source unit being the Nth in the second direction and the light source unit being the (N+L)th in the second direction on the normal line.

16 Claims, 9 Drawing Sheets

(51) Int. Cl.

| | |
|---|---|
| *G02F 1/13357* | (2006.01) |
| *H10H 29/24* | (2026.01) |
| *H10H 29/85* | (2025.01) |
| *H10H 29/851* | (2025.01) |
| *H10H 29/852* | (2025.01) |
| *H10H 29/855* | (2025.01) |
| *H10H 29/856* | (2025.01) |

(52) U.S. Cl.
CPC ....... *H10H 29/8517* (2025.01); *H10H 29/856* (2025.01); *H10H 29/857* (2025.01)

(56) References Cited

U.S. PATENT DOCUMENTS

| | | | |
|---|---|---|---|
| 2019/0094618 A1 | 3/2019 | Kyoukane et al. | |
| 2020/0248890 A1 | 8/2020 | Osaka et al. | |
| 2021/0088713 A1 | 3/2021 | Chen et al. | |
| 2021/0096291 A1* | 4/2021 | Emura ................. | G02B 6/0038 |
| 2023/0152511 A1 | 5/2023 | Okado et al. | |

FOREIGN PATENT DOCUMENTS

| | | |
|---|---|---|
| JP | 2019-121790 | 7/2019 |
| JP | 2020-122921 | 8/2020 |
| JP | 2022-119500 | 8/2022 |
| JP | 2023-500553 | 1/2023 |
| JP | 2023-066718 | 5/2023 |
| JP | 2023-085178 | 6/2023 |

* cited by examiner

300

20A,20     20B,20     20C,20

161,16     162,16     162,16

10L     10M     10M 10A,10     10B,10     10C,10

161,16

$\alpha_1$ 10D,10     10E,10     10F,10

10L     10M $\alpha_2$ 20D,20     20E,20     20F,20

10L     10L     10M 10G,10     10H,10     10I,10

20G,20     20H,20     20I,20

X

Y

300A

300

10

10

10

161,16

10

10

10

α₂

Y

α₁

10

10

162, 16

X

Y

LIGHT-EMITTING MODULE AND PLANAR LIGHT SOURCE

CROSS-REFERENCE TO RELATED APPLICATIONS

The present application claims priority under 35 U.S.C. § 119 to Japanese Patent Application No. 2023-218439, filed Dec. 25, 2023, the contents of which is hereby incorporated by reference in its entirety.

BACKGROUND

1. Technical Field

Embodiments according to the present invention relate to a light-emitting module and a planar light source.

2. Description of Related Art

A light-emitting module obtained by combining a light-emitting element such as a light-emitting diode with a light guide member is widely used in, for example, a planar light source such as a backlight for a liquid crystal display. For example, Japanese Patent Publication No. 2019-61929 describes a backlight device including an LED substrate provided with a reflective sheet and a plurality of light-emitting diodes, and a diffusion plate facing the LED substrate.

SUMMARY

An embodiment according to the present invention can advantageously provide a light-emitting module and a planar light source that can reduce luminance unevenness.

According to an aspect of the present invention, a light-emitting module includes a plurality of light source units arranged in a first direction and in a second direction orthogonal to the first direction, in which each of the light source units includes at least one light-emitting element and a light-transmissive member covering the light-emitting element and having a lateral surface of the light source unit from which light from the light-emitting element is emitted, and in a top view, on a normal line passing through a center of the lateral surface of the light source unit being Mth in the first direction and Nth in the second direction, the lateral surface of the light source unit being (M+1)th in the first direction and {N+L (where L is a natural number greater than or equal to 2)}th in the second direction is positioned, while no light source unit is present between the light source unit being the Nth in the second direction and the light source unit being the (N+L)th in the second direction on the normal line.

According to another aspect of the present invention, a light-emitting module includes a light guide member having a first surface, a second surface opposite to the first surface, and a plurality of through holes penetrating from the first surface to the second surface; a plurality of light source units each located in a corresponding one of the through holes, the plurality of light source units being arranged in a first direction and in a second direction orthogonal to the first direction; and a plurality of light adjustment members each located above a corresponding one of the light source units and covering a corresponding one of the through holes, in which each of the light source units includes at least one light-emitting element and a light-transmissive member covering the light-emitting element and having a lateral surface of the light source unit from which light from the light-emitting element is emitted, and in a top view, on a normal line passing through a center of the lateral surface of a given light source unit of the plurality of light source units, no other light source unit is located.

A light-emitting module and a planar light source according to an embodiment of the present invention can reduce luminance unevenness.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION OF EMBODIMENT

Description of Embodiments

Figure 1:
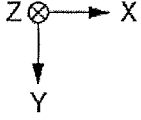
FIG. 1 is a schematic plan view of a planar light source according to the present embodiment.

Embodiments are described below with reference to the drawings. The drawings schematically illustrate the embodiments, and thus scales, intervals, positional relationships, or the like of members may be exaggerated, or illustration of some of the members may be omitted. In the present specification, a direction of an arrow on a Z axis is defined as an upward direction and a direction opposite to the direction of the arrow on the Z axis is defined as a downward direction. Viewing an object from above is referred to as a top view, and the top view is synonymous with a plan view. As a cross-sectional view, an end view illustrating only a cut surface may be illustrated.

In the following description, components having substantially the same function may be denoted by the same reference characters and a description thereof may be omitted. Terms indicating a specific direction or position (for example, "upper", "lower", and other terms including those terms) may be used. However, these terms are used merely to make it easy to understand relative directions or positions in the referenced drawing. As long as the relative direction or position is the same as that described in the referenced drawing using the term such as "upper" or "lower", in drawings other than the drawings of the present disclosure, actual products, and the like, components need not be arranged in the same manner as that in the referenced drawing. In the present specification, "parallel" includes not only a case in which two straight lines, sides, surfaces, or the like do not intersect even if extended, but also a case in which two straight lines, sides, surfaces, or the like intersect such that an angle formed by the two straight lines, sides, surfaces, or the like is in a range of 10° or less. In addition, "orthogonal" means a case in which two straight lines, sides, surfaces, or the like intersect each other in a range of 90°±10°, and includes a case in which two straight lines, sides, surfaces, or the like do not intersect each other but would intersect each other when they are extended. In the present specification, a positional relationship expressed by using the term "on" includes a case in which an object is in contact and also a case in which an object is not in contact but located above.

Embodiment

A light-emitting module 100 and a planar light source 300 of an embodiment will be described with reference to FIGS. 1 to 8. FIG. 1 is a schematic diagram of the planar light source 300 viewed from a light-emitting surface side. As illustrated in FIG. 1, two directions that are parallel to the light-emitting surface of the planar light source 300 and are orthogonal to each other are referred to as an X direction and a Y direction. A direction orthogonal to the X direction and the Y direction is referred to as a Z direction. In the present specification, a plane parallel to the X direction and the Y direction may be referred to as an XY plane. In the XY plane, the direction inclined from the X direction at an angle of 0° or more and less than 360° may be referred to as a lateral direction, and the Z direction may be referred to as a vertical direction.

Figure 2:
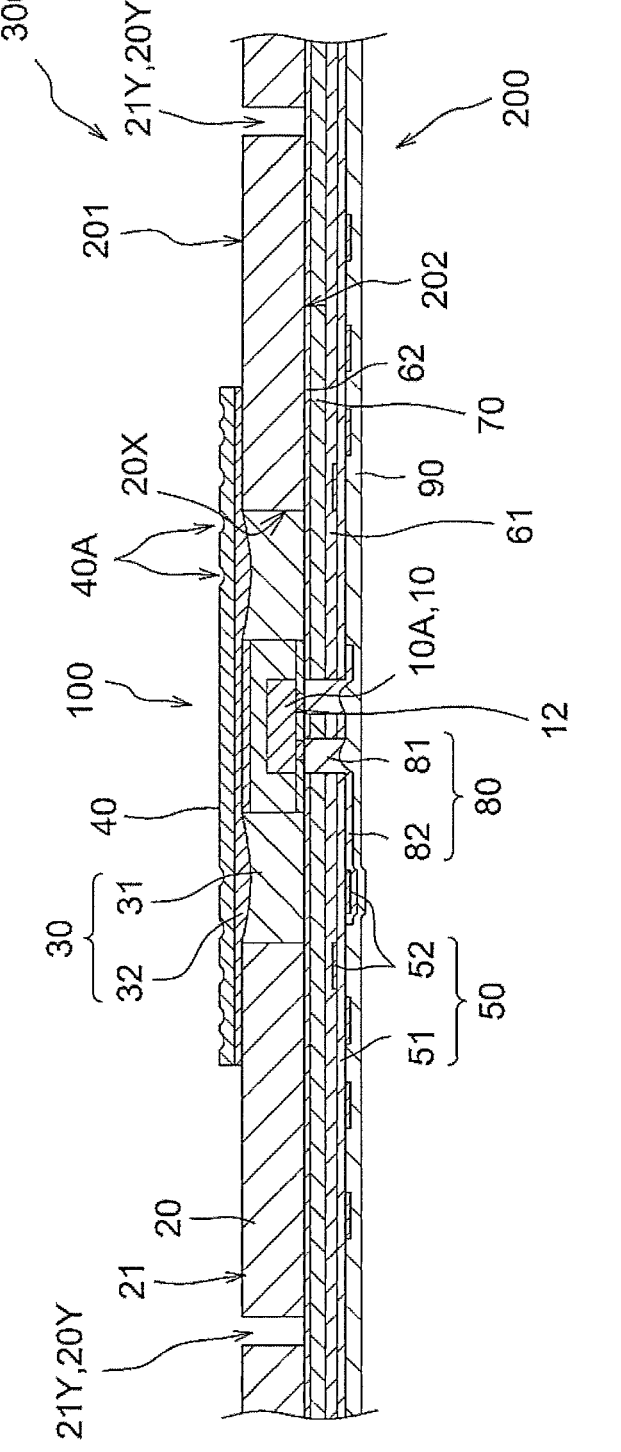
FIG. 2 is a schematic cross-sectional view taken along line II-II in FIG. 1.
Figure 3A:
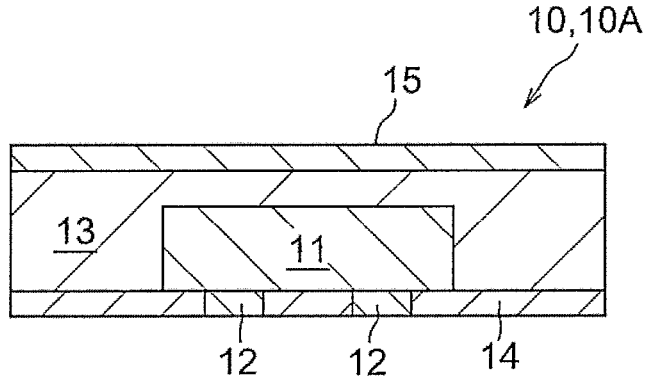
FIG. 3A is a schematic cross-sectional view of a light source unit according to the present embodiment.
Figure 3A:
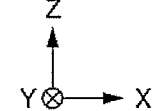

The planar light source 300 includes a light-emitting module 100 and a support member 200 as illustrated in FIG. 2. The light-emitting module 100 is located on the support member 200. The light-emitting module 100 includes a light guide member 20, a light source unit 10, a light-transmissive member 30, and a light adjustment member 40. A plurality of light source units 10 are arranged in a first direction and a second direction. Hereinafter, the first direction may be referred to as the Y direction, and the second direction may be referred to as the X direction. As illustrated in FIG. 3A, each of the light source units 10 includes a light-emitting element 11 and a light-transmissive member (hereinafter may also be referred to as a light source light-transmissive member 13). The light source light-transmissive member 13 covers the light-emitting element 11 and includes a lateral surface of the light source unit 10 from which light from the light-emitting element 11 is emitted.

Figure 4:
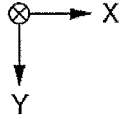
FIG. 4 is a diagram for explaining a planar light source according to the present embodiment.

FIG. 4 is a diagram for explaining a planar light source 300 according to the present embodiment, and is a diagram for explaining the light-emitting module 100 included in the planar light source 300. As illustrated in FIG. 4, in a top view, the light-emitting module 100 is provided such that, on a normal line 16 passing through the centers of lateral surfaces of the light source unit 10 which is the Mth in the first direction and the Nth in the second direction (hereinafter may be referred to as a first light source unit 10L), lateral surfaces of the light source unit 10 which is the (M+1)th in the first direction and the {N+L (where L is a natural number greater than or equal to 2)}th in the second direction (hereinafter may be referred to as a second light source unit 10M) are located, while no light source unit 10 is present between the first light source unit 10L and the second light source unit 10M on the normal line 16. Here, the second light source unit 10M is the light source unit 10 closest to the first light source unit 10L on the normal line 16.

Since no light source unit 10 is present between the first light source unit 10L and the second light source unit 10M on the normal line 16 passing through the centers of the lateral surfaces of the first light source unit 10L in a top view, the number of light source units 10 having light that overlaps with and is similar to the light traveling on the normal line 16 passing through the centers of the lateral surfaces of the first light source unit 10L can be reduced. This facilitates the reduction of the luminance unevenness in the light-emitting module 100. This also facilitates the reduction of color unevenness in the light-emitting module 100 in a form in which the light source unit 10 includes a plurality of light-emitting elements 11 having different peak wavelengths, and in a form in which the light source unit 10 includes the plurality of light-emitting elements 11 having different emission colors.

Hereinafter, the elements constituting the light-emitting module 100 and the planar light source 300 will be described in detail.

Light Source Unit 10

As illustrated in FIG. 1, the light-emitting module 100 includes a plurality of light source units 10 including a first light source 10A, a second light source 10B, a third light source 10C, a fourth light source 10D, a fifth light source 10E, a sixth light source 10F, a seventh light source 10G, an eighth light source 10H, and a ninth light source 10I.

In the light source units 10, each of the light source units 10 of the first light source 10A, the second light source 10B, the third light source 10C, the fourth light source 10D, the fifth light source 10E, the sixth light source 10F, the seventh light source 10G, the eighth light source 10H, and the ninth light source 10I preferably includes a plurality of light-emitting elements 11. Peak wavelengths of the plurality of light-emitting elements 11 included in each of the light source units 10 can be the same or different.

Each of the light source units 10 preferably includes a plurality of light-emitting elements 11. Each of the light source units 10 preferably includes a first light-emitting element 111 that emits blue light and a second light-emitting element 112 that emits green light. For example, in a case in which each of the light source units 10 includes only two light-emitting elements 11, the peak wavelengths of the light emission of the light-emitting elements can be selected from the combinations of blue light and green light, blue light and red light, ultraviolet light and blue light, ultraviolet light and green light, ultraviolet light and red light, green light and red light, and the like. For example, in a case in which each of the light source units 10 includes only three light-emitting elements 11, the peak wavelengths of the light emission of the light-emitting elements can be selected from the combinations of two blue lights and one green light, one blue light and two green lights, blue light, green light, and red light, and blue light, green light, and ultraviolet light. In a case in which each of the light source units 10 includes three light-emitting elements 11, the peak wavelengths of the light emission of the light-emitting elements can be selected from the combinations of blue light and green light, ultraviolet light, green light, and red light, ultraviolet light, blue light, and red light, ultraviolet light, green light, and red light, and the like.

Figure 5:
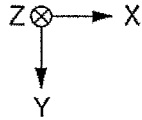
FIG. 5 is a schematic plan view of a portion Vin FIG. 1.
Figure 6:
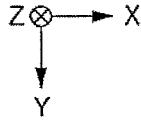
FIG. 6 is a diagram for explaining the planar light source according to the present embodiment.

FIG. 5 is a schematic plan view of the portion V in a schematic plan view of the planar light source 300 according to the present embodiment described with reference to FIG. 1. FIG. 6 is a diagram for explaining the planar light source 300 according to the present embodiment, in which the light-transmissive member 30, the light adjustment member 40, and the like are appropriately omitted in order to explain the light source unit 10 and a wiring substrate 50 of the support member 200. As illustrated in FIG. 5 or 6, each of the light source units 10 preferably includes two first light-emitting elements 111 and one second light-emitting element 112 located between the two first light-emitting elements 111. The first light-emitting elements 111 and the second light-emitting elements 112 are electrically connected in series between a pair of electrodes 12 of each of the light source units 10. In the present embodiment, the first light-emitting element 111, the second light-emitting element 112, and the first light-emitting element 111 are connected in series in this order. The first light-emitting element 111 and the second light-emitting element 112 are preferably connected to each other via a connecting portion 81 of the wiring substrate 50 of the support member 200, which is an element different from the light source unit 10. As illustrated in FIG. 6, the first light-emitting element 111 includes a first terminal 11A and a second terminal 11B. The second light-emitting element 112 includes two terminals 11C. The first terminal 11A of the first light-emitting element 111 is the electrode 12 of the light source unit 10. The second terminal 11B of the first light-emitting element 111 is a terminal electrically connected to one of the two terminals 11C of the second light-emitting element 112. The second terminal 11B of the first light-emitting element 111 and the one terminal 11C of the second light-emitting element 112 are connected to each other via the connecting portion 81 of the wiring substrate 50. The first light-emitting element 111 and the second light-emitting element 112 can be connected to each other via a conductive material included in the light source unit 10.

As illustrated in FIG. 3A, the light source unit 10 includes the light-emitting element 11 and the light-emitting element 11 includes a semiconductor layered body. The semiconductor layered body includes, for example, a substrate of sapphire, gallium nitride, or the like, and an n-type semiconductor layer, a p-type semiconductor layer, and a light-emitting layer sandwiched between the n-type semiconductor layer and the p-type semiconductor layer, which are disposed on the substrate. The light-emitting element 11 includes an n-side electrode electrically connected to the n-type semiconductor layer and a p-side electrode electrically connected to the p-type semiconductor layer. The n-side electrode and the p-side electrode form a part of a lower surface of the light-emitting element 11. The light source unit 10 includes a pair of positive and negative electrodes 12. The pair of positive and negative electrodes 12 form a part of a lower surface of the light source unit 10. One of the pair of electrodes 12 is electrically connected to the p-side electrode, and the other is electrically connected to the n-side electrode. The light source unit 10 need not include the electrodes 12. When the light source unit 10 does not include the pair of positive and negative electrodes 12, the n-side electrode and the p-side electrode of the light-emitting element 11 form a part of the lower surface of the light source unit 10. The light source unit 10 need not include a substrate of sapphire, gallium nitride, or the like. This makes it easier to downsize the light source unit 10 in the vertical direction.

The structure of the light-emitting layer can be a structure including a single active layer such as a double heterostructure and a single quantum well (SQW) structure, or a structure including a group of active layers such as a multiple quantum well (MQW) structure. The light-emitting layer can emit visible light or ultraviolet light. The light-emitting layer can emit light, as visible light, from blue light to red light. As the semiconductor layered body including the light-emitting layer, for example, $In_xAl_yGa_{1-x-y}N$ ($0 \leq x$, $0 \leq y$, $x+y \leq 1$) can be included. The semiconductor layered body can include at least one light-emitting layer that can achieve the light emission described above. For example, the semiconductor layered body can have a structure including one or more light-emitting layers between the n-type semiconductor layer and the p-type semiconductor layer, or can have a structure in which a structure including the n-type semiconductor layer, the light-emitting layer, and the p-type semiconductor layer in order is repeated multiple times. When the semiconductor layered body includes a plurality of light-emitting layers, the semiconductor layered body can include light-emitting layers having different peak wavelengths, or can include light-emitting layers having the same peak wavelength. Note that the same peak wavelength can allow a variation of approximately several nm, for example. A combination of such light-emitting layers can be selected as appropriate, and, for example, when the semiconductor layered body includes two light-emitting layers, the light-emitting layers can be selected from combinations of blue light and blue light, green light and green light, red light and red light, ultraviolet light and ultraviolet light, blue light and green light, blue light and red light, green light and red light, and the like. The light-emitting layer can include a plurality of active layers having different peak wavelengths, or can include a plurality of active layers having the same peak wavelength.

As illustrated in FIG. 3A, the light source unit 10 includes the light source light-transmissive member 13. The light source light-transmissive member 13 covers an upper surface and lateral surfaces of the light-emitting element 11. The light-emitting element 11 can be protected by the light source light-transmissive member 13. The light source light-transmissive member 13 can be disposed exposing a part of the upper surface of the light-emitting element 11. This makes it easier to downsize the light source unit 10 in the vertical direction.

Lateral surfaces of the light source light-transmissive member 13 are lateral surfaces of the light source unit 10. Light from the light-emitting element 11 is mainly emitted from the lateral surfaces of the light source light-transmissive member 13. In a cross-sectional view, the lateral surfaces of the light source light-transmissive member 13 can be parallel to the Z direction or can be inclined with respect to the Z direction. When the lateral surfaces of the light source light-transmissive member 13 are inclined with respect to the Z direction in a cross-sectional view, the lateral surfaces of the light source light-transmissive member 13 can be inclined such that the length of the light source light-transmissive member 13 in the lateral direction in a cross-sectional view becomes longer or shorter toward the lower side. In addition, a pair of lateral surfaces of the light source light-transmissive member 13 in a cross-sectional view can be inclined at the same angle with respect to the Z direction. In a cross-sectional view, the lateral surfaces of the light source light-transmissive member 13 can be stepped.

For example, the light source light-transmissive member 13 has light transmissivity to light emitted by the light-emitting element 11. The light source light-transmissive member 13 contains a light-transmissive resin, and can further contain a wavelength conversion substance. For example, a phosphor can be used as the wavelength conversion substance. Examples of the light-transmissive resin that can be used include a silicone resin and an epoxy resin. Examples of the phosphor that can be used include an yttrium aluminum garnet-based phosphor (for example, $(Y,Gd)_3(Al,Ga)_5O_{12}$:Ce), a lutetium aluminum garnet-based phosphor (for example, $Lu_3(Al,Ga)_5O_{12}$:Ce), a terbium aluminum garnet-based phosphor (for example, $Tb_3(Al,Ga)_5O_{12}$:Ce), a CCA-based phosphor (for example, $Ca_{10}(PO_4)_6Cl_2$:Eu), an SAE-based phosphor (for example, $Sr_4Al_{14}O_{25}$:Eu), a chlorosilicate-based phosphor (for example, $Ca_8MgSi_4O_{16}Cl_2$:Eu), a silicate-based phosphor (for example, $(Ba,Sr,Ca,Mg)_2SiO_4$:Eu), an oxynitride-based phosphor such as a $\beta$-SiAlON-based phosphor (for example, $(Si,Al)_3(O,N)_4$:Eu) or an $\alpha$-SiAlON-based phosphor (for example, $Ca(Si,Al)_{12}(O,N)_{16}$:Eu), a nitride-based phosphor such as an LSN-based phosphor (for example, $(La,Y)_3Si_6N_{11}$:Ce), a BSESN-based phosphor (for example, $(Ba,Sr)_2Si_5N_8$:Eu), an SLA-based phosphor (for example, $SrLiAl_3N_4$:Eu), a CASN-based phosphor (for example, $CaAlSiN_3$:Eu), or an SCASN-based phosphor (for example, $(Sr,Ca)AlSiN_3$:Eu), a fluoride-based phosphor such as a KSF-based phosphor (for example, $K_2SiF_6$:Mn), a KSAF-based phosphor (for example, $K_2(Si_{1-x}Al_x)F_{6-x}$:Mn, where x satisfies 0<x<1), or an MGF-based phosphor (for example, $3.5MgO\cdot0.5MgF_2\cdot GeO_2$:Mn), a quantum dot having a perovskite structure (for example, $(Cs,FA,MA)(Pb,Sn)(F,Cl,Br,I)_3$, where FA and MA represent formamidinium and methylammonium, respectively), a II-VI group quantum dot (for example, CdSe), a III-V group quantum dot (for example, InP), and a quantum dot having a chalcopyrite structure (for example, $(Ag,Cu)(In,Ga)(S,Se)_2$). As the phosphor added to the light source light-transmissive member 13, one type of phosphor can be used, or a plurality of types of phosphors can be used.

When the light source unit 10 includes the first light-emitting element 111 that emits blue light and the second light-emitting element 112 that emits green light, the light source light-transmissive member 13 contains a phosphor that emits red light, thus allowing the light-emitting module 100 to emit white light. Furthermore, when the phosphor that emits red light and the phosphor that emits green light are contained, the light-emitting module 100 can emit white light. Specific examples of the phosphor that emits red light include a KSF-based phosphor (for example, $K_2SiF_6$:Mn), and specific examples of the phosphor emitting green light include a $\beta$-SiAlON-based phosphor (for example, $(Si,Al)_3(O,N)_4$:Eu).

A wavelength conversion sheet containing the phosphor described above can be disposed above the planar light source 300. The wavelength conversion sheet can serve as a planar light source that absorbs a part of the blue light from the light source unit 10, emits yellow light, green light, and/or red light, and emits white light. For example, the light source unit 10 that can emit blue light and the wavelength conversion sheet containing a phosphor that can emit yellow light can be combined to produce white light. Alternatively, the light source unit 10 that can emit blue light and the wavelength conversion sheet containing a red phosphor and a green phosphor can be combined. Further, the light source unit 10 that can emit blue light and a plurality of the wavelength conversion sheets can be combined. An example of the plurality of wavelength conversion sheets that can be selected includes a combination of a wavelength conversion sheet containing a phosphor that can emit red light and a wavelength conversion sheet containing a phosphor that can emit green light. Further, the light source unit 10 including the light-emitting element 11 that can emit blue light and the light source light-transmissive member 13 containing a phosphor that can emit red light, and a wavelength conversion sheet containing a phosphor that can emit green light can be combined.

As a phosphor that can emit yellow light used in the wavelength conversion sheet, the yttrium aluminum garnet-based phosphor is preferably used, for example. Further, as a phosphor that can emit green light used in the wavelength conversion sheet, for example, the quantum dot having the perovskite structure, the III-V group quantum dot, or the quantum dot having the chalcopyrite structure described above, which has a narrow half-value width of a light emission peak wavelength, is preferably used. Further, as a phosphor that can emit red light used in the wavelength conversion sheet, for example, the KSF-based phosphor, the KSAF-based phosphor, the III-V group quantum dot, or the quantum dot having the chalcopyrite structure described above, which has a narrow half-value width of a light emission peak wavelength like the phosphor that can emit green light, is preferably used.

A band-pass filter that transmits light of a specific wavelength region and reflects light of other wavelength regions can be disposed between the wavelength conversion sheet and the light source unit 10. As the band-pass filter, for example, a dichroic sheet is used. The band-pass filter preferably transmits only blue light and reflects light of other colors (green light and red light). This allows only the blue light of the light from the light source unit 10 to be incident on the wavelength conversion sheet. Thus, when the band-pass filter is used in combination with a wavelength conversion sheet that absorbs a part of the blue light from the light source unit 10 and emits white light, white light can easily be emitted from the wavelength conversion sheet. This also reduces the likelihood of returning of the light (for example, green light, red light, or the like) other than the blue light that has transmitted through the band-pass filter and been reflected by the wavelength conversion sheet to the light source unit 10 side. This makes it possible to reduce luminance unevenness in the light-emitting module 100.

A diffusion sheet can be disposed between the band-pass filter and the light source unit 10. The diffusion sheet can transmit the light from the light source unit 10 and diffuse the transmitted light when the light is emitted from the diffusion sheet to the band-pass filter side. This makes it possible to reduce the luminance unevenness in the light-emitting module 100. The diffusion sheet faces a first surface 201 of the light guide member 20 and the upper surfaces of the light-transmissive member 30 and the light adjustment member 40. The diffusion sheet can be in contact with or spaced apart from the first surface 201 of the light guide member 20 and the upper surface of the light-transmissive member 30 and/or the upper surface of the light adjustment member 40. The diffusion sheet is preferably made of a material having low absorptivity for the light emitted from the light-emitting element 11. Examples of the diffusion sheet include polycarbonate, polystyrene, acrylic, polyethylene, and the like. The diffusion sheet can include fine irregularities on the emission surface or can include an optical film having light diffusibility. The diffusion sheet can be constituted by a single layer or can be constituted by a layered body of a plurality of layers.

A prism sheet can be disposed facing a surface of the wavelength conversion sheet on the side opposite to the light source unit 10. A plurality of prisms extending in one direction are arranged on the surface of the prism sheet. As the prism sheet, a single prism sheet can be used, or a plurality of prism sheets can be layered and used. When the plurality of prism sheets are layered and used, for example, one of the plurality of prism sheets can serve as a prism extending in the X direction and another one can serve as a prism extending in the Y direction. This allows the light emitted from the prism sheet to be along the direction perpendicular to the emission surface of the prism sheet, thereby increasing the luminance of the light-emitting module 100 in a top view.

The light source unit 10 can further include a covering member (may also be referred to as a light source covering member 14). The light source covering member 14 is disposed on a lower surface of the light-emitting element 11. The light source covering member 14 is disposed such that lower surfaces of the electrodes 12 of the light source unit 10 are exposed from the light source covering member 14. The light source covering member 14 is also disposed on a lower surface of the light source light-transmissive member 13 covering the lateral surfaces of the light-emitting element 11.

The light source covering member 14 has reflectivity to the light emitted from the light-emitting element 11. For the light source covering member 14, for example, a resin member containing a gas such as nitrogen or oxygen, a resin member containing light-scattering particles, or the like can be used. Examples of the resin member of the light source covering member 14 include a thermoplastic resin such as an acrylic resin, a polycarbonate resin, a cyclic polyolefin resin, a polyethylene terephthalate resin, or a polyester resin, or a thermosetting resin such as an epoxy resin or a silicone resin. Examples of the light-scattering particles of the light source covering member 14 include particles of titania, silica, alumina, zinc oxide, magnesium oxide, zirconia, yttria, calcium fluoride, magnesium fluoride, niobium pentoxide, barium titanate, tantalum pentoxide, barium sulfate, glass, or the like. The light source covering member 14 can contain both the gas and the light-scattering particles.

As illustrated in FIG. 3A, the light source unit 10 can include a light adjustment member (hereinafter may also be referred to as a light source light adjustment member 15). The light source light adjustment member 15 forms at least a part of an upper surface of the light source unit 10. The light source light adjustment member 15 is disposed above the light-emitting element 11. The light source light adjustment member 15 and the light-emitting element 11 overlap each other in a top view and, at the overlapped portion, the light source light adjustment member 15 is disposed above the light-emitting element 11. The light source light adjustment member 15 is disposed on the upper side of the light source light-transmissive member 13, and adjusts the amount and/or emission direction of light emitted from the upper surface of the light source light-transmissive member 13. The light source light adjustment member 15 has reflectivity and light transmissivity to light emitted by the light-emitting element 11. A part of the light emitted from the upper surface of the light source light-transmissive member 13 is reflected by the light source light adjustment member 15, and the other part is transmitted through the light source light adjustment member 15. A transmittance of the light source light adjustment member 15 with respect to a peak wavelength of the light-emitting element 11 is, preferably in a range from 1% to 50%, more preferably in a range from 3% to 30%, for example. Since the light source unit 10 includes the light source light adjustment member 15, it is possible to inhibit a region directly above the light source unit 10 from becoming too bright. This makes it possible to reduce luminance unevenness in the light-emitting module 100.

The light source light adjustment member 15, for example, can be formed using a resin member containing light-scattering particles. A material similar to the material of the resin member of the light source covering member 14 can be used as the resin member of the light source light adjustment member 15. A material similar to the material of the light-scattering particles of the light source covering member 14 can be used for the light-scattering particles of the light source light adjustment member 15. The light source light adjustment member 15 can be, for example, a metal member such as aluminum or silver, or a dielectric multilayer film.

Figure 3B:
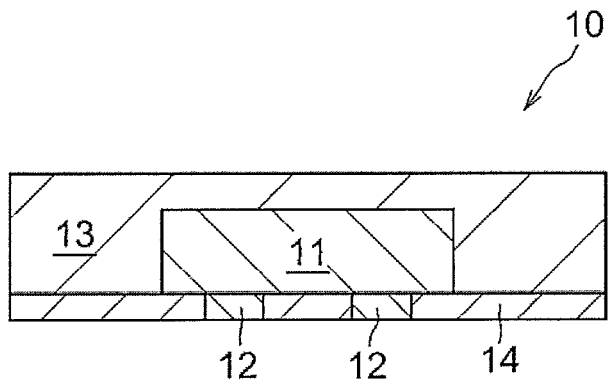
FIG. 3B is a schematic cross-sectional view of a light source unit according to another embodiment.
Figure 3B:
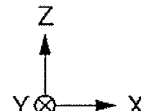

As illustrated in FIG. 3B, the light source unit 10 need not include the light source light adjustment member 15. This makes it easier to downsize the light source unit 10 in the vertical direction than when the light source unit 10 includes the light source light adjustment member 15 disposed above the light-emitting element 11. In another form, the light source unit 10 need not include the light source covering member 14. For example, a lower surface of the light source unit can be formed by the lower surface of the light-emitting element, the lower surfaces of the pair of electrodes 12, and the lower surface of the light source light-transmissive member. In another form, the light source unit 10 can be only a single light-emitting element 11. In another form, the light source unit 10 need not include the light source covering member 14 and the light source light-transmissive member 13, and can include the light source light adjustment member 15 disposed on the upper surface of the light-emitting element 11. In another form, the light source unit 10 need not include the light source light-transmissive member 13, and can include the light source light adjustment member 15 disposed on the upper surface of the light-emitting element 11 and the light source covering member 14 disposed on the lower surface of the light-emitting element 11.

In a top view, the shape of the light source unit 10 is not particularly limited. Preferably, the shape of the light source unit 10 is quadrangular in a top view.

As illustrated in FIG. 1, the plurality of light source units 10 are preferably arranged in a lattice point pattern at constant intervals in the X direction and the Y direction. The first light source 10A, the second light source 10B, and the third light source 10C are arranged in this order in the X direction. The fourth light source 10D, the fifth light source 10E, and the sixth light source 10F are arranged in this order in the X direction. The seventh light source 10G, the eighth light source 10H, and the ninth light source 10I are arranged in this order in the X direction. The first light source 10A, the fourth light source 10D, and the seventh light source 10G are arranged in this order in the Y direction. The second light source 10B, the fifth light source 10E, and the eighth light source 10H are arranged in this order in the Y direction. The third light source 10C, the sixth light source 10F, and the ninth light source 10I are arranged in this order in the Y direction. The plurality of light source units 10 need not be arranged in the lattice point pattern as long as they are arranged in the X direction and the Y direction.

As illustrated in FIG. 6, each of the light source units 10 has a plurality of normal lines 16 passing through the centers of the lateral surfaces of the light source unit 10 in a top view. Here, the light source unit 10 includes, for example, two first light-emitting elements 111 that emit blue light, and the second light-emitting element 112 that emits green light between the two first light-emitting elements 111. In a top view, the outer shape of the light source unit 10 is a quadrangle consisting of four lateral surfaces. In a top view, each of the three light-emitting elements 11 has a rectangular shape consisting of four lateral surfaces. The three light-emitting elements 11 are arranged side by side such that the long-side lateral surfaces of the light-emitting elements 11 are parallel to a lateral surface of the light source unit 10 and the short-side lateral surfaces of the light-emitting elements 11 are parallel to another lateral surface of the light source unit 10. Among the first light-emitting elements 111 and the second light-emitting element 112, the normal line 16 intersecting only the second light-emitting element 112 is referred to as a first normal line 161. The normal line 16 intersecting the first light-emitting elements 111 and the second light-emitting element 112 is referred to as a second normal line 162. As illustrated in FIG. 4, in a top view, the lateral surfaces of the sixth light source 10F are located on the first normal line 161 passing through the centers of the lateral surfaces of the first light source 10A, while no light source unit 10 is located between the first light source 10A and the sixth light source 10F on the first normal line 161. Similarly, the lateral surfaces of the ninth light source 10I are located on the first normal line 161 passing through the centers of the lateral surfaces of the fourth light source 10D, while no light source unit 10 is located between the fourth light source 10D and the ninth light source 10I on the first normal line 161. In a top view, the lateral surfaces of the second light source 10B are located on the second normal line 162 passing through the centers of the lateral surfaces of the seventh light source 10G, while no light source unit is located between the seventh light source 10G and the second light source 10B on the second normal line 162. Similarly, the lateral surfaces of the third light source 10C are located on the second normal line 162 passing through the centers of the lateral surfaces of the eighth light source 10H, while no light source unit 10 is located between the eighth light source 10H and the third light source 10C on the second normal line 162. For a given light source unit 10, other light source units 10 having their lateral surfaces thereof located on the normal line 16 are preferably located as far away from the given light source unit 10 as possible.

In summary, the plurality of light source units 10 have the following positional relationship in the present embodiment. On the normal line 16 passing through the centers of the lateral surfaces of the light source unit 10 which is the Mth in the first direction and the Nth in the second direction (first light source unit 10L), the lateral surfaces of the light source unit 10 which is the (M+1)th in the first direction and the {N+L (where L is a natural number greater than or equal to 2)}th in the second direction (second light source unit 10M) are located, while no light source unit 10 is present between the first light source unit 10L and the second light source unit 10M on the normal line 16. Note that it is assumed that the second light source unit 10M is the light source unit 10 closest to the first light source unit 10L, on the corresponding normal line 16 in this case.

Here, in the present specification, "the lateral surfaces of the light source unit 10 are located on the normal line 16" means that the normal line 16 intersects the lateral surfaces of the light source unit 10. For example, the normal line 16 of the light source unit 10 which is the Mth in the first direction and the Nth in the second direction can be orthogonal to or inclined with respect to the lateral surfaces of the light source unit 10 which is the (M+1)th in the first direction and the (N+L)th in the second direction.

In the present embodiment, the plurality of light source units 10 have the above-described positional relationship regardless of whether the normal line 16 is the first normal line 161 or the second normal line 162. The plurality of light source units 10 can have the above-described positional relationship with respect to, for example, only the first normal line 161 or the second normal line 162.

By thus positioning and sizing the plurality of light source units 10, no light source unit 10 is present between the first light source unit 10L and the second light source unit 10M on the normal line 16 of the first light source unit 10L, allowing the reduction of the number of light source units 10 having light overlapping with and similar to the light traveling on the normal line 16 passing through the centers of the lateral surfaces of the first light source unit 10L. This makes it possible to inhibit the region located on the normal line 16 passing through the centers of the lateral surfaces of the first light source unit 10L from becoming too bright, facilitating the reduction in the luminance unevenness in the light-emitting module 100. In particular, when the light source unit 10 includes the plurality of light-emitting elements 11 that emit different colors of light, such as the first light-emitting element 111 that emits blue light and the second light-emitting element 112 that emits green light, the reduction of the color unevenness caused by such different colors can be facilitated.

Among the normal lines 16 of the first light source units 10L, the normal line 16 intersecting the lateral surface of the second light source unit 10M forms an angle preferably in a range from 22° to 32°, more preferably from 23° to 30°, and still more preferably from 25° to 29° with the second direction. For example, the lateral surfaces of the sixth light source 10F are located on the first normal line 161 passing through the centers of the lateral surfaces of the first light source 10A. Therefore, the angle $\alpha_1$ formed between the first normal line 161 passing through the centers of the lateral surfaces of the first light source 10A and the X direction, which is the second direction, is preferably in the range described above. For example, the lateral surfaces of the second light source 10B are located on the second normal line 162 passing through the centers of the lateral surfaces of the seventh light source 10G. Therefore, the angle $\alpha_2$ formed between the second normal line 162 passing through the centers of the lateral surfaces of the seventh light source 10G and the Y direction, which is the second direction, is preferably in the range described above. This makes it possible to reduce the number of the light source units having light overlapping with and similar to the light traveling on the normal line 16 passing through the centers of the lateral surfaces of the first light source unit 10L. This makes it possible to inhibit the region located on the normal line 16 passing through the centers of the lateral surfaces of the light source unit 10 from becoming too bright, facilitating the reduction of the luminance unevenness in the light-emitting module 100. In particular, when the light source unit includes a plurality of light-emitting elements that emit different colors of light, the reduction of the color unevenness can be facilitated.

In the present embodiment, the light source unit 10 preferably has a rectangular shape or a square shape with one side in a range from 0.5 mm to 2 mm in a top view, and specific examples thereof include a square shape with 1 mm on each side. The light-emitting element 11 included in the light source unit 10 preferably has a rectangular shape in a top view, and preferably has a long side in a range from 400 μm to 1000 μm, and a short side in a range from 100 μm to 600 μm. As a specific example, the light-emitting element 11 has a rectangular shape with a long side of 600 μm and a short side of 200 μm.

In the present embodiment, in the plurality of light source units 10 arranged in the lattice point pattern, the distance between the light source units 10 adjacent to each other in the first direction or the second direction (the length of a line segment connecting the centers of the light source units 10) is preferably in a range from 4 mm to 13 mm, and is specifically 8 mm. When the light guide member 20 described below includes a partition groove 20Y, the shape of one region separated by the partition groove 20Y in a top view is preferably rectangular or square, and the size of one region separated by the partition groove 20Y is preferably in a range from 4 mm to 13 mm in each of the first direction and the second direction, and is specifically 8 mm.

In a top view, the direction in which the first light-emitting element 111, the second light-emitting element 112, and the first light-emitting element 111 are arranged (that is, the direction along the second normal line 162) can be parallel in all of the plurality of light source units 10, or can be rotated by 90° with respect to an adjacent one of the light source units 10.

Light Guide Member 20

The light guide member 20 is a member that has light transmissivity to light emitted by the light source unit 10. A transmittance of the light guide member 20 with respect to a peak wavelength of the light source unit 10 is preferably, for example, 60% or greater, more preferably 80% or greater. As illustrated in FIG. 2, the light guide member 20 has a first surface 201 serving as the light-emitting surface of the light-emitting module 100 and a second surface 202 located on the opposite side of the first surface 201. The light guide member 20 is provided with a through hole 20X penetrating from the first surface 201 to the second surface 202. As illustrated in FIG. 1, the light source unit 10 is located in the through hole 20X of the light guide member 20. The light guide member 20 surrounds the light source unit 10 in a top view. In the present embodiment, the through hole 20X has a circular shape in a top view. In a top view, the through hole 20X can be elliptical, or can have a polygonal shape such as a triangle, a quadrangle, a hexagon, or an octagon.

In a cross-sectional view, the length in the lateral direction of the through hole 20X can be the same from the first surface 201 to the second surface 202, or can be different between the upper side and the lower side. When the length in the lateral direction of the through hole 20X is different between the upper side and the lower side in a cross-sectional view, the lateral surface of the through hole 20X can be inclined with respect to the Z direction or can be stepped including a surface parallel to the XY plane.

The number of light guide members 20 included in the light-emitting module 100 can be one or plural. In the present embodiment, the light-emitting module 100 includes a plurality of light guide members 20 including a first light guide portion 20A, a second light guide portion 20B, a third light guide portion 20C, a fourth light guide portion 20D, a fifth light guide portion 20E, a sixth light guide portion 20F, a seventh light guide portion 20G, an eighth light guide portion 20H, and a ninth light guide portion 20I. As illustrated in FIG. 1, in the X direction, the first light guide portion 20A, the second light guide portion 20B, and the third light guide portion 20C are arranged in this order. In the X direction, the fourth light guide portion 20D, the fifth light guide portion 20E, and the sixth light guide portion 20F are arranged in this order. In the X direction, the seventh light guide portion 20G, the eighth light guide portion 20H, and the ninth light guide portion 20I are arranged in this order. In the Y direction, the first light guide portion 20A, the fourth light guide portion 20D, and the seventh light guide portion 20G are arranged in this order. In the Y direction, the second light guide portion 20B, the fifth light guide portion 20E, and the eighth light guide portion 20H are arranged in this order. In the Y direction, the third light guide portion 20C, the sixth light guide portion 20F, and the ninth light guide portion 20I are arranged in this order.

The first light source 10A is located in the through hole 20X of the first light guide portion 20A. The second light source 10B is located in the through hole 20X of the second light guide portion 20B. The third light source 10C is located in the through hole 20X of the third light guide portion 20C. The fourth light source 10D is located in the through hole 20X of the fourth light guide portion 20D. The fifth light source 10E is located in the through hole 20X of the fifth light guide portion 20E. The sixth light source 10F is located in the through hole 20X of the sixth light guide portion 20F. The seventh light source 10G is located in the through hole 20X of the seventh light guide portion 20G. The eighth light source 10H is located in the through hole 20X of the eighth light guide portion 20H. The ninth light source 10I is located in the through hole 20X of the ninth light guide portion 20I.

The light guide member 20 is divided by the partition groove 20Y. The partition groove 20Y need not be provided. Providing the partition groove 20Y improves the contrast between the light-emitting region in the light-emitting state and the light-emitting region in the non-light-emitting state. One region separated by the partition groove 20Y is referred to as a light-emitting region 300A. In the present embodiment, the first light guide portion 20A, the second light guide portion 20B, the third light guide portion 20C, the fourth light guide portion 20D, the fifth light guide portion 20E, the sixth light guide portion 20F, the seventh light guide portion 20G, the eighth light guide portion 20H, and the ninth light guide portion 20I separated by the partition groove 20Y are different light-emitting regions 300A. One light-emitting region 300A can be used as a driving unit for local dimming. The number of light-emitting regions 300A constituting the planar light source 300 is not particularly limited. For example, the planar light source 300 can include one light-emitting region 300A or a plurality of light-emitting regions 300A. A plurality of planar light sources 300 can be arranged to prepare a planar light source device having a larger area. A member having reflectivity to the light emitted by the light source unit 10 can be disposed in the partition groove 20Y. The light-emitting module need not include the member having reflectivity to the light emitted by the light source unit 10 in the partition groove 20Y.

In the present embodiment, the light guide member 20 can include the lattice-shaped partition groove 20Y constituted by a first partition groove 21Y extending in the Y direction and a second partition groove 22Y extending in the X direction.

The lateral surfaces of the partition groove 20Y can be surfaces parallel to the Z direction or can be surfaces inclined with respect to the Z direction. When the lateral surfaces of the partition groove 20Y are surfaces inclined with respect to the Z direction, the distance between the lateral surfaces facing each other in the partition groove 20Y can be shorter or longer toward the lower side.

As illustrated in FIG. 1, the light guide member 20 is preferably provided with a light guide hole portion 21 that opens in the first surface 201 and/or the second surface 202 of the light guide member 20. In a top view, the light guide hole portion 21 is located between the through hole 20X and the partition groove 20Y. In the present embodiment, the light guide hole portion 21 is a recessed portion that opens only on the first surface 201 side. The light guide hole portion 21 can be a recessed portion that opens only on the second surface 202 side, or can be a through hole that penetrates from the first surface 201 to the second surface 202 of the light guide member 20. Providing the light guide hole portion 21 in the light guide member 20 can increase the surface area of the light guide member 20. In that case, it is possible to increase the amount of light that is extracted from the surface of the light guide member 20 to the outside of the light guide member 20. This improves the light extraction efficiency of the light-emitting module 100. In a top view, the light guide hole portion 21 is preferably located apart from the light source unit. This makes it possible to inhibit the region directly above the light source unit 10 from becoming too bright.

The light guide member 20 can include one light guide hole portion 21 or a plurality of light guide hole portions 21. As illustrated in FIG. 1, in a top view, the plurality of light guide hole portions 21 preferably surround the light source unit 10. This makes it easier to take out the light traveling laterally from the light source unit 10 to the outside of the light guide member 20 by the plurality of light guide hole portions 21. In a top view, the plurality of light guide hole portions 21 surrounding the light source unit 10 facilitates mixing of high-luminance portions and low-luminance portions in the vicinity of the light guide hole portions 21. This allows the boundary between the luminance of the portion located inside the outer edge of the light guide hole portion 21 and the luminance of the portion located outside the outer edge of the light guide hole portion 21 to be less noticeable in a top view. In a top view, one light guide hole portion 21 can seamlessly surround the light source unit 10.

The shape of the light guide hole portions 21 in a top view is not particularly limited. As illustrated in FIG. 1, the shape of the light guide hole portions 21 of the present embodiment includes a linear portion. In the present specification, "linear" includes, in its category, a straight line, a curved line, a bent line, and the like. In a top view, the shape of the light guide hole portion 21 can be a V-shape or an L-shape extending in two directions. In a top view, the shape of the light guide hole portion 21 can be a circle, an ellipse, or a polygon such as a triangle, a quadrangle, a hexagon, or an octagon.

In the present specification, as illustrated in FIG. 1, a point which is farthest from the center of the first light source 10A and is on an outer edge of the first light guide portion 20A located on the first surface 201 is referred to as a first point P1, and a point which is closest to the center of the first light source 10A and is on the outer edge of the first light guide portion 20A located on the first surface 201 is referred to as a second point P2. In the present embodiment, the first point P1 is located at each corner of the first light guide portion 20A, and the second point P2 is located at the center of each side of the first light guide portion 20A. The number of the first points P1 and the second points P2 can each be one or plural.

In a top view, at least one of the light guide hole portions 21 is preferably located on a first virtual straight line IL connecting the center of the first light source 10A and the first point P1. This makes it possible to reduce the luminance unevenness in the light-emitting module 100. Although the first point P1 farther from the first light source 10A tends to have a lower luminance than the second point P2 located closer to the first light source 10A, the location of the light guide hole portion 21 on the first virtual straight line IL makes it easier to increase the amount of light taken out from the light guide member 20 in the vicinity of the first point P1. This makes it possible to reduce the difference between the luminance at the first point P1 and the luminance at the second point P2, facilitating the reduction of the luminance unevenness in the light-emitting module 100.

The plurality of light guide hole portions 21 are preferably located on the first virtual straight line IL connecting the center of the first light source 10A and the first point P1. This makes it easier to adjust the luminance in the vicinity of the first point P1, facilitating the reduction of the luminance unevenness in the light-emitting module 100. The number of the light guide hole portions 21 located on the first virtual straight line IL is preferably larger than the number of the light guide hole portions 21 located on a second virtual straight line IIL connecting the center of the first light source 10A and the second point P2. This makes it easier to reduce the difference in luminance between the first point P1 and the second point P2. The light guide hole portion 21 need not be present on the second virtual straight line IIL.

In a top view, at least one of the light guide hole portions 21 preferably extends from an end portion of the light guide hole portion 21 closer to the center of the first light source 10A in an inclined manner in the X direction and the Y direction away from the first light source 10A. This makes it possible to guide a part of the light from the first light source 10A in the direction in which the light guide hole portion 21 extends. This makes it possible to reduce the luminance unevenness in the light-emitting module 100.

A material similar to that of the resin member of the light source covering member 14 can be used as the material of the light guide member 20. Glass or the like can be used as the material of the light guide member 20. The light guide member 20 can contain a phosphor and/or light-scattering particles.

The thickness of the light guide member 20 is preferably in a range from 150 μm to 800 μm, for example. In the present specification, unless otherwise specified, the thickness of each member is a value measured in the vertical direction at the maximum distance from the upper surface of each member to the lower surface of the member. The light guide member 20 can be constituted by a single layer or can be constituted by a layered body of a plurality of layers in the vertical direction. When the light guide member 20 is constituted by a layered body, a light-transmissive adhesive can be disposed between layers. The layers of the layered body can use different kinds of chief materials.

A method of forming the light guide hole portion 21 in the light guide member 20 is not particularly limited. For example, the light guide hole portion 21 can be formed in the light guide member 20 by laser processing. The light guide hole portion 21 can be formed by heat from laser irradiation. The light guide member including the light guide hole portion 21 can be formed by injection molding, transfer molding, compression molding, or similar methods using a mold or the like.

Light-Transmissive Member 30

As illustrated in FIG. 2, the light-emitting module 100 includes a light-transmissive member 30. The light-transmissive member 30 is a member that has light transmissivity to the light emitted by the light source unit 10. The light-transmissive member 30 includes a first light-transmissive portion 31 and a second light-transmissive portion 32. In the present embodiment, the first light-transmissive portion 31 and the second light-transmissive portion 32 are separate portions. The first light-transmissive portion 31 and the second light-transmissive portion 32 can be integrally formed of the same material. A transmittance of each of the first light-transmissive portion 31 and the second light-transmissive portion 32 with respect to a peak wavelength of the light source unit 10 is preferably, for example, 60% or greater, and more preferably 80% or greater. The light-emitting module 100 need not include the light-transmissive member 30.

As illustrated in FIG. 2, the first light-transmissive portion 31 is preferably in contact with the lateral surface of the light source unit 10. In that case, the light from the light source unit 10 is likely to enter the first light-transmissive portion 31. The first light-transmissive portion 31 is preferably in contact with the light guide member 20. In that case, the light from the light source unit 10 is likely to enter the light guide member 20. When the light-emitting module 100 does not include the light-transmissive member 30, the light guide member 20 can be in contact with the lateral surface of the light source unit 10. In that case, the light from the light source unit 10 is likely to enter the light guide member 20.

It is preferable that the first light-transmissive portion 31 be disposed exposing at least a part of the upper surface of the light source unit 10. In that case, it becomes easier to downsize the light-emitting module 100 in the vertical direction than when the first light-transmissive portion 31 covers the entire upper surface of the light source unit 10. The first light-transmissive portion 31 can be disposed exposing the entire upper surface of the light source unit 10. The first light-transmissive portion 31 can cover the entire upper surface of the light source unit 10. The first light-transmissive portion 31 covers the entire upper surface of the light source unit 10, thereby facilitating adjustment of luminance in a region directly above the light source unit 10. For example, by changing the thickness of a portion of the first light-transmissive portion 31 covering the upper surface of the light source unit 10, the luminance in the region directly above the light source unit 10 can be adjusted. This makes it easy to adjust luminance, so that it becomes easy to reduce luminance unevenness in the light-emitting module 100. When the first light-transmissive portion 31 covers the upper surface of the light source unit 10, the second light-transmissive portion 32 covers the upper surface of the light source unit 10 with the first light-transmissive portion 31 therebetween.

The first light-transmissive portion 31 can be formed of a single layer or can be formed of a layered body of a plurality of layers in the vertical direction. The first light-transmissive portion 31 can contain a phosphor as a wavelength conversion substance or light-scattering particles. When the first light-transmissive portion 31 is a layered body, each layer can contain or need not contain a phosphor and/or light-scattering particles. For example, the first light-transmissive portion 31 can be constituted by a layer containing a phosphor and a layer containing no phosphor. For example, a material similar to that of the resin member of the light source covering member 14 can be used as the material of the first light-transmissive portion 31.

The second light-transmissive portion 32 is located above the light source unit 10. The second light-transmissive portion 32 is located above the first light-transmissive portion 31. The second light-transmissive portion 32 is preferably in contact with the upper surface of the light source unit 10 and/or the upper surface of the first light-transmissive portion 31. This makes it easier to downsize the light-emitting module 100 in the vertical direction.

A material similar to that of the resin member of the covering member 14 can be used as the material of the second light-transmissive portion 32, for example.

Examples of the second light-transmissive portion 32 that can be used include an optically clear adhesive (OCA) having a sheet shape. The second light-transmissive portion 32 can contain a phosphor as a wavelength conversion substance or light-scattering particles.

Light Adjustment Member 40

A light adjustment member 40 has reflectivity and light transmissivity to the light emitted by the light source unit 10. A part of the light emitted from the light source unit 10 is reflected by the light adjustment member 40, and the other part is transmitted through the light adjustment member 40. The transmittance of the light adjustment member 40 with respect to the peak wavelength of the light emitted by the light source unit 10 is lower than the transmittance of the light guide member 20 with respect to the peak wavelength of the light emitted by the light source unit 10. For example, the transmittance of the light adjustment member 40 with respect to the peak wavelength of the light emitted by the light source unit 10 is preferably in a range from, for example, 1% to 50%, and more preferably from 3% to 30%. The light adjustment member 40 can be constituted by a single layer or can be constituted by a layered body of a plurality of layers.

The light adjustment member 40 is disposed above the light source unit 10. The light adjustment member 40 and the light source unit 10 overlap in a top view and, at the overlapped portion, the light adjustment member 40 is located above the light source unit 10. Since the light adjustment member 40 is located above the light source unit 10, it is possible to inhibit the region directly above the light source unit 10 from becoming too bright.

The light adjustment member 40 is disposed above the first light-transmissive portion 31. The light adjustment member 40 and the first light-transmissive portion 31 overlap in a top view and, at the overlapped portion, the light adjustment member 40 is located above the first light-transmissive portion 31. The light adjustment member 40 is located above the first light-transmissive portion 31, so that a region directly above the first light-transmissive portion 31 can be inhibited from becoming too bright.

The light adjustment member 40 is disposed above the second light-transmissive portion 32. The light adjustment member 40 and the second light-transmissive portion 32 overlap each other in the top view and, at the overlapped portion, the light adjustment member 40 is located above the second light-transmissive portion 32. The light adjustment member 40 is located above the second light-transmissive portion 32, so that a region directly above the second light-transmissive portion 32 can be inhibited from becoming too bright.

As illustrated in FIG. 5, in a top view, at least a part of the outer edge of the light adjustment member 40 is preferably located outside of the outer edge of the through hole 20X. This can inhibit the region near the outer edge of the through hole 20X from becoming too bright. In a top view, the entire outer edge of the light adjustment member 40 can be located outside of the outer edge of the through hole 20X. This makes it possible to inhibit the region near the outer edge of the through hole 20X becoming even too bright. Also, in a top view, the entire outer edge of the light adjustment member 40 can be located inside of the outer edge of the through hole 20X. This makes it easier to increase the area of the light-transmissive member 30 exposed from the light adjustment member 40 in a top view. Thus, it is possible to increase the amount of light that is extracted to the outside of the light-transmissive member 30 from the light-transmissive member 30.

Figure 7:
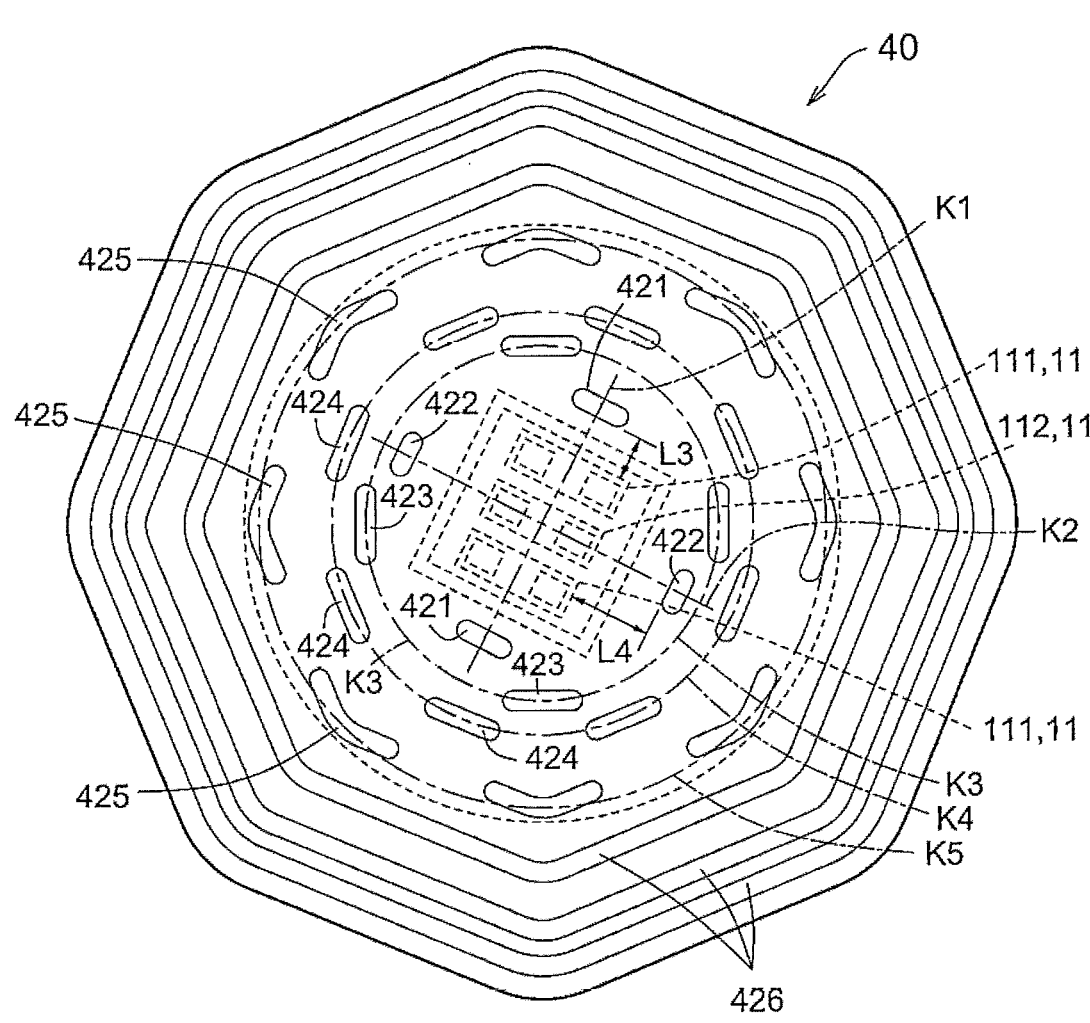
FIG. 7 is a schematic plan view of a light adjustment member according to the present embodiment.
Figure 7:
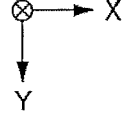

As illustrated in FIG. 7, the light adjustment member 40 includes a plurality of grooves (hereinafter can also be referred to as light adjustment grooves 42). By providing the light adjustment member 40 including the light adjustment grooves 42, it is easier to adjust the brightness in a region directly above the light adjustment member 40. The light adjustment grooves 42 preferably include a plurality of first grooves 421, a plurality of second grooves 422, a plurality of third grooves 423, a plurality of fourth grooves 424, a plurality of fifth grooves 425, and a plurality of outer circumferential grooves 426. Accordingly, it is easier to reduce the color unevenness in the light source unit 10 including a plurality of light-emitting elements 11 having different peak wavelengths, such as the light source unit 10 including the first light-emitting element 111 that emits blue light and the second light-emitting element 112 that emits green light.

In a top view, the first grooves 421 intersect a virtual line K1, which is parallel to the direction in which the plurality of light-emitting elements are arranged and pass through the centers of the light-emitting elements. The longitudinal direction of each of the first grooves 421 is preferably orthogonal to the direction in which the plurality of light-emitting elements are arranged. In this case, each of the first grooves 421 faces a corresponding one of the first light-emitting elements 111. The maximum length of the first groove 421 in the longitudinal direction is preferably in a range from 10% to 100%, more preferably from 30% to 90%, still more preferably from 40% to 80% the maximum length of the first light-emitting element 111. The minimum distance L3 between the first light-emitting element 111 and the first groove 421 is preferably in a range from 10% to 100%, more preferably from 20% to 75%, still more preferably from 30% to 50% the thickness of the light source unit.

In a top view, the second groove 422 intersects a virtual line K2, which is orthogonal to the direction in which the plurality of light-emitting elements 11 are arranged and pass through the center of the second light-emitting element 112. The longitudinal direction of each of the second grooves 422 is preferably parallel to the direction in which the plurality of light-emitting elements 11 are arranged. In this case, each of the second grooves 422 faces a corresponding one of the second light-emitting elements 112. The maximum length of the second groove 422 in the longitudinal direction is preferably shorter than the maximum length of the first groove 421, and more preferably equal to or shorter than the minimum distance between the two first light-emitting elements 111. The maximum length of the second groove 422 is preferably in a range from 30% to 90%, more preferably from 40% to 85%, still more preferably from 55% to 75% the maximum length of the first groove 421 in the longitudinal direction.

A minimum distance L4 between the second groove 422 and the second light-emitting element 112 is preferably longer than the minimum distance between the first light-emitting element 111 and the first groove 421. The minimum distance between the second groove 422 and the second light-emitting element 112 is preferably in a range from 110% to 500%, more preferably from 150% to 400%, still more preferably from 175% to 300% the minimum distance between first light-emitting element 111 and the first groove 421.

The plurality of third grooves 423 are formed along a first virtual circle K3. The radius of the first virtual circle K3 is greater than the maximum distance from the center of the light source unit 10 to the second groove 422. The plurality of fourth grooves 424 are formed along a second virtual circle K4. The radius of the second virtual circle K4 is greater than the radius of the first virtual circle K3. The plurality of fifth grooves 425 are formed along an octagonal virtual line K5. The radius of the circumscribed circle of the octagonal virtual line K5 is greater than the radius of the second virtual circle K4. The plurality of fifth grooves 425 are formed in an L-shape corresponding to the respective corners of the octagonal virtual line K5, and adjacent ones of the fifth grooves 425 are separated from each other. Each of the plurality of fourth grooves 424 is located between adjacent ones of the fifth grooves 425 in the circumferential direction. Each of the plurality of third grooves 423 is located between adjacent ones of the fourth grooves 424 in the circumferential direction.

The outer circumferential grooves 426 are formed along the outer circumferential edge of the light adjustment member 40. The shape of each of the outer circumferential grooves 426 in a top view is octagonal. In a top view, the shape of the outer circumferential groove 426 can be an ellipse, a circle, or a polygon such as a triangle, a quadrangle, a hexagon, or the like. The plurality of outer circumferential grooves 426 surround the first grooves 421, the second grooves 422, the third grooves 423, the fourth grooves 424, and the fifth grooves 425. The plurality of outer circumferential grooves 426 are formed at intervals from the center to the outer circumferential edge of the light adjustment member 40.

The maximum length (maximum width) of each of the light adjustment grooves 42 in the direction orthogonal to the longitudinal direction thereof is preferably in a range from 0.01 mm to 0.2 mm, more preferably from 0.02 mm to 0.08 mm, and still more preferably from 0.03 mm to 0.07 mm. The light adjustment grooves 42 need not penetrate over the entire length or can partially penetrate.

Support Member 200

As illustrated in FIG. 2, the support member 200 is a member on which the light-emitting module 100 is disposed. The light guide member 20 is disposed on the support member 200 with the second surface 202 facing an upper surface of the support member 200.

The support member 200 includes a wiring substrate 50. The wiring substrate 50 includes an insulating base body 51, and at least one wiring layer 52 disposed on at least one surface of the insulating base body 51. The insulating base body 51 can be a rigid substrate or can be a flexible substrate. The insulating base body 51 is preferably a flexible substrate in order to reduce the thickness of the planar light source 300. The insulating base body 51 can be formed of a single layer or can be formed of a layered body of a plurality of layers in the vertical direction. For example, the insulating base body 51 can be constituted by a single-layer flexible substrate or can be constituted by a layered body of a plurality of rigid substrates. An example of a material of the insulating base body 51 that can be used includes a resin such as polyimide. The wiring layer 52 is a metal film, for example, a copper film.

The support member 200 further includes a first adhesive layer 61 disposed on the wiring substrate 50, a reflective member 70 disposed on the first adhesive layer 61, and a second adhesive layer 62 disposed on the reflective member 70.

The first adhesive layer 61 is disposed between the wiring substrate 50 and the reflective member 70 and bonds the wiring substrate 50 and the reflective member 70. The first adhesive layer 61, for example, can be formed of a resin member containing light-scattering particles. For example, a material similar to that of the resin member of the light source covering member 14 can be used as the resin member of the first adhesive layer 61. For example, a material similar to that of the light-scattering particles of the light source covering member 14 can be used for the light-scattering particles of the first adhesive layer 61. Examples of the first adhesive layer 61 that can be used include an optically clear adhesive having a sheet shape.

The refractive index of the resin member of the first adhesive layer 61 is preferably lower than the refractive index of the resin member of the reflective member 70. In that case, a part of light traveling from the reflective member 70 to the first adhesive layer 61 tends to be totally reflected at an interface between the reflective member 70 and the first adhesive layer 61. As a result, light escaping to below the light-emitting module 100 can be reduced, so that the light extraction efficiency of the light-emitting module 100 is improved.

The reflective member 70 is disposed below the light guide member 20, below the light source unit 10, and below the light-transmissive member 30. The reflective member 70 has reflectivity to the light emitted by the light source unit 10. The reflective member 70 can be formed of a resin member and a reflector contained in the resin member. For example, a material similar to that of the resin member of the light source covering member 14 can be used as the resin member of the reflective member 70. A material similar to that of the light-scattering particles of the light source covering member 14 can be used as the material of the reflector of the reflective member 70. A gas such as nitrogen and/or oxygen can be used as the reflector of the reflective member 70. The reflective member 70 can contain both light-scattering particles and a gas as reflectors.

The refractive index of the reflector of the reflective member 70 is preferably lower than the refractive index of the resin member of the reflective member 70. In that case, a part of the light from the light source unit 10 incident on the reflective member 70 tends to be totally reflected at an interface between the resin member of the reflective member 70 and the reflector of the reflective member 70. This makes it possible to reduce downward escaping of light from the reflective member 70, improving the light extraction efficiency of the light-emitting module 100.

When the refractive index of the reflector of the reflective member 70 is lower than the refractive index of the resin member of the reflective member 70, the refractive index of the resin member of the reflective member 70 is preferably higher than the refractive index of the base material of the light guide member 20. In that case, it becomes easy to increase the difference in refractive index between the resin member of the reflective member 70 and the reflector of the reflective member 70. Accordingly, a part of the light from the light source unit 10 incident on the reflective member 70 tends to be totally reflected at the interface between the resin member of the reflective member 70 and the reflector of the reflective member 70.

The second adhesive layer 62 is disposed between the reflective member 70 and the second surface 202 of the light guide member 20 and bonds the reflective member 70 and the light guide member 20. The light source unit 10 is disposed above the second adhesive layer 62 in the through hole 20X of the light guide member 20. The second adhesive layer 62, for example, can be formed of a resin member containing light-scattering particles. For example, a material similar to that of the resin member of the light source covering member 14 can be used as the resin member of the second adhesive layer 62. For example, a material similar to that of the light-scattering particles of the light source covering member 14 can be used for the light-scattering particles of the second adhesive layer 62. Examples of the second adhesive layer 62 that can be used include an optically clear adhesive having a sheet shape.

The refractive index of the resin member of the second adhesive layer 62 is preferably lower than the refractive index of the base material of the light guide member 20. In that case, a part of light traveling from the light guide member 20 to the second adhesive layer 62 tends to be totally reflected at an interface between the light guide member 20 and the second adhesive layer 62. As a result, light escaping to below the light-emitting module 100 can be reduced, so that the light extraction efficiency of the light-emitting module 100 is improved. The refractive index of the resin member of the second adhesive layer 62 is preferably lower than the refractive index of a base material of the first light-transmissive portion 31. This facilitates total reflection of a part of light traveling from the first light-transmissive portion 31 to the second adhesive layer 62 at an interface between the first light-transmissive portion 31 and the second adhesive layer 62. As a result, light escaping to below the light-emitting module 100 can be reduced, so that the light extraction efficiency of the light-emitting module 100 is improved.

The support member 200 further includes a conductive member 80. The conductive member 80 includes, for example, a resin and metal particles contained in the resin. Examples of the resin of the conductive member 80 that can be used include an epoxy resin and a phenol resin. Examples of the metal particles that can be used include copper particles and silver particles.

The conductive member 80 includes a connecting portion 81 and a wiring portion 82. The connecting portion 81 penetrates the second adhesive layer 62, the reflective member 70, the first adhesive layer 61, and the insulating base body 51 in the vertical direction. The wiring portion 82 is disposed on a surface of the wiring substrate 50 on which the wiring layer 52 is disposed and is connected to the connecting portion 81. The connecting portion 81 and the wiring portion 82 can be integrally formed of the same material. A part of the wiring portion 82 is connected to the wiring layer 52.

A pair of conductive members 80 are disposed apart from each other corresponding to the pair of positive and negative electrodes 12 of the light source unit 10. The connecting portion 81 of one of the conductive members 80 is connected to the positive electrode 12 below the light source unit 10, and the connecting portion 81 of the other conductive member 80 is connected to the negative electrode 12 below the light source unit 10. The electrodes 12 of the light source unit 10 are electrically connected to the conductive members 80 and the wiring layer 52.

The support member 200 further includes an insulating layer 90. The insulating layer 90 is disposed on a lower surface of the wiring substrate 50 and covers the wiring layer 52. Examples of the material of the insulating layer 90 that can be used include an epoxy resin, a urethane resin, and an acrylic resin.

Other Embodiments

The light-emitting module 100 of another embodiment is described with reference to FIGS. 8 and 9.

Figure 8:
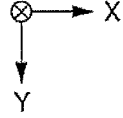
FIG. 8 is a schematic plan view of a planar light source according to another embodiment in which a light adjustment member is omitted.

As illustrated in FIG. 8, as to the plurality of light source units 10, on the first normal line 161 passing through the centers of the lateral surfaces of a given light source unit 10, no other light source unit 10 is present in a top view. As to the plurality of light source units 10, on the second normal line 162 passing through the centers of the lateral surfaces of a given light source unit 10, no other light source unit 10 is present in a top view.

By positioning the plurality of light source units 10 in this manner, no other light source unit 10 is present on the normal line 16 of a given light source unit 10, eliminating the light source units 10 having light overlapping with and similar to the light traveling on the normal line 16 passing through the centers of the lateral surfaces of the light source unit 10. This makes it possible to inhibit the region located on the normal line 16 passing through the centers of the lateral surfaces of the light source unit 10 from becoming too bright, facilitating the reduction of the luminance unevenness in the light-emitting module 100. In particular, when the light source unit 10 includes the plurality of light-emitting elements 11 that emit light of different colors, the reduction of the color unevenness is facilitated.

As illustrated in FIG. 8, the angle di between the normal line 16 of the light source unit 10 and the X direction is preferably in a range from 22° to 23°, and more preferably 22.5°. The angle $\alpha_2$ between the normal line 16 of the light source unit 10 and the Y direction is preferably in a range from 22° to 23°, and more preferably 22.5°. In the present embodiment, the formed angles $\alpha_1$ and $\alpha_2$ are the same, but when the formed angles $\alpha_1$ and $\alpha_2$ are different, the smaller angle (minimum angle) is preferably within the above range. This eliminates the light source units 10 having light overlapping with and similar to the light traveling on the normal line 16 that passes through the centers of the lateral surfaces of the light source unit 10. Accordingly, this makes it possible to inhibit the region located on the normal line 16 that passes through the centers of the lateral surfaces of the light source unit 10 from becoming too bright, facilitating the reduction of the luminance unevenness in the light-emitting module 100. In particular, when the light source unit 10 includes a plurality of light-emitting elements 11 that emit different colors of light, for example, the first light-emitting element 111 that emits blue light and the second light-emitting element 112 that emits green light, the reduction of the color unevenness in the light-emitting module 100 caused by such different colors is facilitated. The size of the light source unit 10, the size of the light-emitting element 11 included in the light source unit 10, the distance between the light source units 10, and the like can be the same as those described in any of the other embodiments of the present specification.

Figure 9:
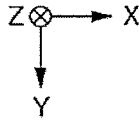
FIG. 9 is a schematic plan view of the planar light source according to another embodiment.

As illustrated in FIG. 9, the light-emitting module 100 preferably includes the light adjustment member 40. In this case, the light adjustment member 40 is preferably octagonal. When the light adjustment member 40 has an octagonal shape, projected corners of the outer circumferential edge of the light adjustment member 40 can be positioned on the first normal line 161 and the second normal line 162. This makes the light adjustment member 40 be longer on the normal line 16 compared to a case in which the sides of the outer circumferential edge of the light adjustment member 40 are located on the normal line 16. This allows the light adjustment member 40 to be longer in the top view, corresponding to the direction in which the emission color of the light-emitting element 11 is stronger, facilitating the reduction of the color unevenness in the light-emitting module 100. Positioning the projected corners of the outer circumferential edge of the light adjustment member 40 on the normal line 16 means positioning, on the normal line 16, the portions each located between corresponding ones of the sides of the outer circumferential edge of the light adjustment member 40. The portions each between corresponding ones of the sides of the outer circumferential edge of the light adjustment member 40 can be angular or curved.

The embodiments of the present invention have been described above with reference to specific examples. However, the present invention is not limited to these specific examples. All aspects that can be practiced by a person skilled in the art changing the design as appropriate based on the above-described embodiments of the present invention are also included in the scope of the present invention, as long as they encompass the spirit of the present invention. In addition, in the spirit of the present invention, a person skilled in the art can conceive of various modified examples and modifications, and those modified examples and modifications will also fall within the scope of the present invention.

The invention claimed is:

1. A light-emitting module comprising:
a plurality of light source units arranged in a first direction and in a second direction orthogonal to the first direction, wherein
each light source unit of the light source units comprises at least one light-emitting element and a light-transmissive member covering the light-emitting element and having a lateral surface of the light source unit from which light from the light-emitting element is emitted, and
in a top view, on a normal line passing through a center of the lateral surface of the light source unit being Mth in the first direction and Nth in the second direction, the lateral surface of the light source unit being (M+1)th in the first direction and {N+L (where L is a natural number greater than or equal to 2)}th in the second direction is positioned, while no light source unit is present between the light source unit being the Nth in the second direction and the light source unit being the (N+L)th in the second direction on the normal line,
wherein each light source unit of the light source units comprises a plurality of the light-emitting elements,
wherein the plurality of light-emitting elements comprise a first light-emitting element that emits blue light and a second light-emitting element that emits green light, and
wherein each light source unit of the light source units comprises two first light-emitting elements each being the first light-emitting element and one second light-emitting element being the second light-emitting element, and the one second light-emitting element is located between the two first light-emitting elements.

2. The light-emitting module according to claim 1, wherein
the normal line comprises a first normal line intersecting only the second light-emitting element and not intersecting the first light-emitting element, and a second normal line intersecting the first light-emitting element and the second light-emitting element, and
in a top view, on the first normal line passing through the center of the lateral surface of the light source unit being the Mth in the first direction and the Nth in the second direction, the lateral surface of the light source unit being the (M+1)th in the first direction and the (N+L)th in the second direction is located.

3. The light-emitting module according to claim 1, wherein the normal line comprises a first normal line intersecting only the second light-emitting element and not intersecting the first light-emitting element, and a second normal line intersecting the first light-emitting element and the second light-emitting element, and in a top view, on the second normal line passing through the center of the lateral surface of the light source unit being the Mth in the first direction and the Nth in the second direction, the lateral surface of the light source unit being the (M+1)th in the first direction and the (N+L)th in the second direction is located.

4. The light-emitting module according to claim 1, wherein the first light-emitting element and the second light-emitting element are connected in series in each of the light source units.

5. The light-emitting module according to claim 1, wherein the light-transmissive member comprises a wavelength conversion substance.

6. The light-emitting module according to claim 1, wherein in a top view, an angle between the normal line and the second direction is in a range from 22° to 32°.

7. The light-emitting module according to claim 1, wherein in a top view, a minimum angle of an angle formed between the normal line and the first direction and an angle formed between the normal line and the second direction is 22.5°.

8. A planar light source comprising:
the light-emitting module according to claim 1; and
a support member provided with the light-emitting module.

9. A light-emitting module comprising:
a light guide member having a first surface, a second surface opposite to the first surface, and a plurality of through holes penetrating from the first surface to the second surface;
a plurality of light source units, each located in a corresponding one of the through holes, the plurality of light source units being arranged in a first direction and in a second direction orthogonal to the first direction; and
a plurality of light adjustment members each located above a corresponding one of the light source units and covering a corresponding one of the through holes, wherein
each light source unit of the light source units comprises at least one light-emitting element and a light-transmissive member covering the light-emitting element and having a lateral surface of the light source unit from which light from the light-emitting element is emitted, and
in a top view, on a normal line passing through a center of the lateral surface of a given light source unit of the plurality of light source units, no other light source unit is located, wherein each light source unit of the light source units comprises a plurality of the light-emitting elements,
wherein the plurality of light-emitting elements comprise a first light-emitting element that emits blue light and a second light-emitting element that emits green light, and
wherein each light source unit of the light source units comprises two first light-emitting elements each being the first light-emitting element and one second light-emitting element being the second light-emitting element, and the one second light-emitting element is located between the two first light-emitting elements.

10. The light-emitting module according to claim 9, wherein
the normal line comprises a first normal line intersecting only the second light-emitting element and not intersecting the first light-emitting element, and a second normal line intersecting the first light-emitting element and the second light-emitting element, and
in a top view, on the first normal line passing through the center of the lateral surface of the light source unit being the Mth in the first direction and the Nth in the second direction, the lateral surface of the light source unit being the (M+1)th in the first direction and the (N+L)th in the second direction is located.

11. The light-emitting module according to claim 9, wherein
the normal line comprises a first normal line intersecting only the second light-emitting element and not intersecting the first light-emitting element, and a second normal line intersecting the first light-emitting element and the second light-emitting element, and
in a top view, on the second normal line passing through the center of the lateral surface of the light source unit being the Mth in the first direction and the Nth in the second direction, the lateral surface of the light source unit being the (M+1)th in the first direction and the (N+L)th in the second direction is located.

12. The light-emitting module according to claim 9, wherein the first light-emitting element and the second light-emitting element are connected in series in each of the light source units.

13. The light-emitting module according to claim 9, wherein the light-transmissive member comprises a wavelength conversion substance.

14. The light-emitting module according to claim 9, wherein in a top view, an angle between the normal line and the second direction is in a range from 22° to 32°.

15. The light-emitting module according to claim 9, wherein in a top view, a minimum angle of an angle formed between the normal line and the first direction and an angle formed between the normal line and the second direction is 22.5°.

16. A planar light source comprising:
the light-emitting module according to claim 9; and
a support member provided with the light-emitting module.

* * * * *